(12) United States Patent
Nasu et al.

(10) Patent No.: US 10,193,101 B2
(45) Date of Patent: Jan. 29, 2019

(54) ELECTRONIC DEVICE

(71) Applicant: SHARP KABUSHIKI KAISHA, Sakai, Osaka (JP)

(72) Inventors: Yasuhiro Nasu, Sakai (JP); Noriko Watanabe, Sakai (JP); Yasumori Fukushima, Sakai (JP); Shinsuke Saida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 70 days.

(21) Appl. No.: 15/129,045

(22) PCT Filed: Mar. 24, 2015

(86) PCT No.: PCT/JP2015/058904
§ 371 (c)(1),
(2) Date: Sep. 26, 2016

(87) PCT Pub. No.: WO2015/146975
PCT Pub. Date: Oct. 1, 2015

(65) Prior Publication Data
US 2017/0110680 A1    Apr. 20, 2017

(30) Foreign Application Priority Data

Mar. 26, 2014   (JP) ................. 2014-063435

(51) Int. Cl.
*H01L 51/00*  (2006.01)
*H01L 51/52*  (2006.01)
*H01B 1/04*   (2006.01)

(52) U.S. Cl.
CPC ............ *H01L 51/524* (2013.01); *H01B 1/04* (2013.01); *H01L 51/0097* (2013.01); *H01L 51/5246* (2013.01); *H01L 51/5237* (2013.01)

(58) Field of Classification Search
CPC .................................................. H01L 51/524
See application file for complete search history.

(56) References Cited

U.S. PATENT DOCUMENTS

2008/0142791 A1*  6/2008  Kim ................. H01L 51/5237
                                                                257/40
2009/0159677 A1   6/2009  Yakimov et al.
(Continued)

FOREIGN PATENT DOCUMENTS

JP   05-283162 A    10/1993
JP   2001-118674 A   4/2001
(Continued)

OTHER PUBLICATIONS

Official Communication issued in International Patent Application No. PCT/JP2015/058904, dated May 12, 2015.

*Primary Examiner* — Moazzam Hossain
(74) *Attorney, Agent, or Firm* — Keating & Bennett, LLP (57) ABSTRACT

An electronic device includes: a flexible substrate, a device portion supported on the flexible substrate, and a driver circuit portion; and a flexible tube having a water vapor transmission rate of less than $10^{-3}$ g/(m$^2$·24 h) and an oxygen transmission rate of less than $10^{-2}$ ml/(m$^2$·24 h·MPa), wherein: the flexible tube forms a first seal structure and a second seal structure at both ends thereof, and has a sealed space therein; a part of the flexible substrate and the device portion are inside the sealed space; and a rest of the flexible substrate, other than the part, is outside the sealed space.

12 Claims, 9 Drawing Sheets

(56) References Cited

U.S. PATENT DOCUMENTS

| | | | |
|---|---|---|---|
| 2010/0148127 A1* | 6/2010 | Ellinger | C09J 123/142 |
| | | | 252/500 |
| 2010/0231840 A1* | 9/2010 | Saida | G02F 1/1333 |
| | | | 349/153 |
| 2010/0238098 A1* | 9/2010 | Watanabe | G02F 1/1339 |
| | | | 345/87 |
| 2012/0138922 A1 | 6/2012 | Yamazaki et al. | |
| 2013/0088662 A1* | 4/2013 | Watanabe | G02F 1/133308 |
| | | | 349/58 |
| 2013/0100392 A1* | 4/2013 | Fukushima | G09F 9/30 |
| | | | 349/150 |
| 2013/0299789 A1* | 11/2013 | Yamazaki | H01L 51/5246 |
| | | | 257/40 |
| 2015/0236304 A1 | 8/2015 | Negishi et al. | |
| 2015/0319813 A1* | 11/2015 | Khachatryan | H05B 33/145 |
| | | | 313/504 |
| 2017/0317309 A1* | 11/2017 | Yang | H05K 5/0086 |

FOREIGN PATENT DOCUMENTS

| | | | |
|---|---|---|---|
| JP | 2002-249313 A | 9/2002 | |
| JP | 2006-299145 A | 11/2006 | |
| JP | 2008-293680 A | 12/2008 | |
| JP | 2011-509645 A | 3/2011 | |
| JP | 2011-108564 A | 6/2011 | |
| JP | 2011108564 A * | 6/2011 | ............ H01L 51/50 |
| JP | 4945860 B2 | 6/2012 | |
| JP | 2012-134475 A | 7/2012 | |
| WO | 2013/094407 A1 | 6/2013 | |

\* cited by examiner

ELECTRONIC DEVICE

TECHNICAL FIELD

The present invention relates to an electronic device, and particularly to a flexible electronic device.

BACKGROUND ART

In recent years, flexible electronic devices have been under development. Organic electronic devices are expected as one type of electronic devices that realizes commercialization of flexible electronic devices.

Since an organic electronic device includes organic electronic elements, which are sensitive to moisture and oxygen, the performance thereof may deteriorate due to the influence of moisture and oxygen. Conventionally, organic electronic elements are placed on a glass substrate and covered by a sealing can with a desiccant sealed therein, for example, in order to reduce the influence of moisture and oxygen on the organic electronic elements. Since the glass substrate and the sealing can are not flexible, it is difficult to apply such an electronic device to a flexible electronic device.

Patent Document 1 discloses a resin substrate having a gas barrier property. The resin substrate of Patent Document 1 is obtained by forming a thin film of inorganic oxide having a good gas barrier property on a resin film. Patent Document 1 discloses an organic EL element, which is sealed by being formed on a resin substrate and covered by another resin substrate.

CITATION LIST

Patent Literature

[Patent Document No. 1] Japanese Laid-Open Patent Publication No. 2006-299145

SUMMARY OF INVENTION

Technical Problem

However, with an electronic device including electronic elements sealed by two resin substrates covering the electronic elements attached to each other, as shown in FIG. 8 of Patent Document 1, it is not possible in some cases to achieve a sufficient reliability. The area where the two resin substrates are attached together with the electronic elements sealed therein has a poorer water vapor barrier property and a poorer oxygen barrier property than those of the resin substrates themselves. Therefore, due to water vapor and oxygen that have passed through the area where the resin substrates are attached together, the performance of the electronic elements may deteriorate and the reliability of the electronic device may deteriorate.

The present invention, which has been made in order to solve the problem set forth above, has an object to prevent the performance of electronic elements from deteriorating due to the influence of moisture and/or oxygen and to improve the reliability of a flexible electronic device.

Solution to Problem

An electronic device according to an embodiment of the present invention includes: a flexible substrate, a device portion supported on the flexible substrate, and a driver circuit portion; and a flexible tube having a water vapor transmission rate of less than $10^{-3}$ g/(m²·24 h) and an oxygen transmission rate of less than $10^{-2}$ ml/(m²·24 h·MPa), wherein: the flexible tube forms seal structures at both ends thereof, and has a sealed space therein; a part of the flexible substrate and the device portion are inside the sealed space; and a rest of the flexible substrate, other than the part, is outside the sealed space.

An electronic device according to another embodiment of the present invention includes: a flexible substrate, a device portion supported on the flexible substrate, and a driver circuit portion; a first flexible tube having a water vapor transmission rate of less than $10^{-3}$ g/(m²·24 h) and an oxygen transmission rate of less than $10^{-2}$ ml/(m²·24 h·MPa); and a second flexible tube provided on an inner side of the first flexible tube and having a water vapor transmission rate of less than $10^{-3}$ g/(m²·24 h) and an oxygen transmission rate of less than $10^{-2}$ ml/(m²·24 h·MPa), wherein: the first flexible tube and the second flexible tube form seal structures at both ends thereof; a sealed space is present between the first flexible tube and the second flexible tube; a part of the flexible substrate and the device portion are inside the sealed space; and a rest of the flexible substrate, other than the part, is outside the sealed space.

In one embodiment, the sealed space is filled with an inert gas or an insulative inert liquid.

In one embodiment, neither a gas nor a liquid is present in the sealed space.

In one embodiment, the driver circuit portion is inside the sealed space.

In one embodiment, the driver circuit portion is outside the sealed space.

In one embodiment, a plurality of terminals connected to the device portion or the driver circuit portion are outside the sealed space.

In one embodiment, the electronic device further includes a control circuit portion, wherein: the control circuit portion is inside the sealed space.

In one embodiment, the control circuit portion has a contactless power receiving or NFC (Near Field Communication) function.

Advantageous Effects of Invention

According to an embodiment of the present invention, it is possible to prevent the performance of electronic elements from deteriorating due to the influence of moisture and/or oxygen and to improve the reliability of a flexible electronic device.

BRIEF DESCRIPTION OF DRAWINGS

FIG. 3 (a) is a schematic cross-sectional view of the electronic device 100, taken along line 3B-3B' of FIG. 1, and (b) is a schematic perspective view of the electronic device 100.

FIGS. 6 (a) and (b) are schematic cross-sectional views of the electronic device 100A, taken along line 6B-6B' of FIG. 4.

DESCRIPTION OF EMBODIMENTS

Electronic devices according to embodiments of the present invention will now be described with reference to the drawings. The electronic devices according to the embodiments are flexible electronic devices. Note however that the present invention is not limited to the embodiments illustrated below. Note that in the figures to be discussed below, components of substantially the same functions are denoted by the same reference signs, and the description thereof may be omitted.

(Embodiment 1)

Figure 1:
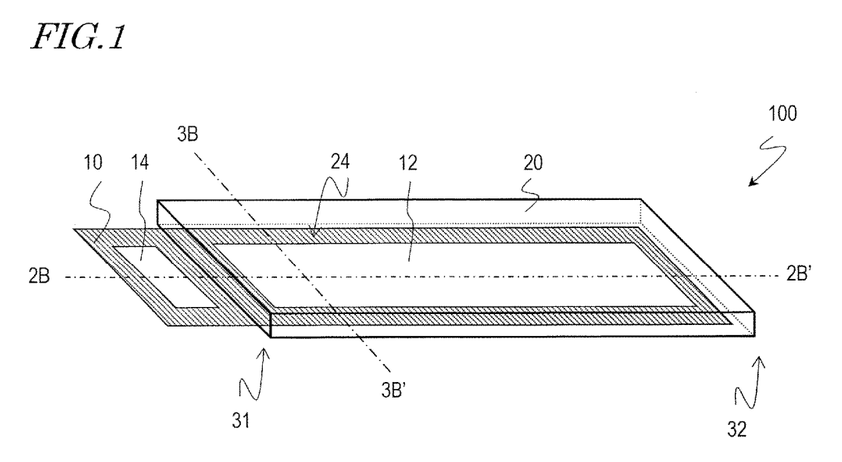
FIG. 1 A view schematically showing an electronic device 100 according to an embodiment of the present invention.

FIG. 1 schematically shows an electronic device 100 according to Embodiment 1 of the present invention.

The electronic device 100 includes a flexible substrate 10, a device portion 12 supported on the flexible substrate 10, a driver circuit portion 14, and a flexible tube 20. The flexible tube 20 has a water vapor transmission rate of less than $10^{-3}$ g/(m²·24h) and an oxygen transmission rate of less than $10^{-2}$ ml/(m²·24h·MPa). The flexible tube 20 forms a first seal structure 31 and a second seal structure 32 at the opposite ends thereof. The flexible tube 20 has a sealed space 24 therein. A part of the flexible substrate 10 and the device portion 12 are inside the sealed space 24, while the rest of the flexible substrate 10 is outside the sealed space 24.

Herein, the device portion 12 includes a plurality of electronic elements (not shown), and the driver circuit portion 14 includes a circuit for driving the electronic elements of the device portion 12. For example, when the electronic device 100 is an organic EL display device, the device portion 12 includes a plurality of organic EL elements, and the driver circuit portion 14 supplies predetermined signals to the organic EL elements.

Note that hereinafter the direction along line 2B-2B' of FIG. 1 may be referred to as the longitudinal direction of the flexible tube 20 or the flexible substrate 10, and the direction along line 3B-3B' of FIG. 1 may be referred to as the width direction of the flexible tube 20 or the flexible substrate 10.

Since the flexible tube 20 has a low water vapor transmission rate and a low oxygen transmission rate, the flexible tube 20 has a good water vapor barrier property and a good oxygen barrier property. The sealed space 24 in the flexible tube 20 is formed as the opposite ends of the flexible tube 20 are closed by the first seal structure 31 and the second seal structure 32. Therefore, the electronic device 100 has a seal structure along edges extending in the width direction of the flexible tube 20 but has no seal structure along edges extending in the longitudinal direction of the flexible tube 20.

In conventional electronic devices, two resin substrates are attached together along edges extending in the longitudinal direction of the flexible substrate and along edges extending in the width direction thereof. Ambient moisture and oxygen enter primarily through attached portions (seal structures) along edges extending in the longitudinal direction of the flexible substrate and edges extending in the width direction thereof, thereby causing problems for the electronic elements. The concentration of moisture, etc., is high in the vicinity of the attached portions, and it increases even in the central portion inside the sealed space as time passes. Thus, with conventional electronic devices, problems likely occur in the vicinity of edges extending in the longitudinal direction and edges extending in the width direction.

In contrast, since the electronic device 100 has no seal structure along edges extending in the longitudinal direction of the flexible tube 20, the amount of moisture and oxygen entering the sealed space 24 through edges extending in the longitudinal direction of the flexible tube 20 is reduced as compared with conventional electronic devices. The electronic device 100 has the device portion inside the sealed space 24, thereby reducing the influence of moisture and oxygen on the electronic elements of the device portion 12. The electronic device 100 has a good reliability because the performance of electronic elements is prevented from deteriorating. Particularly, the reliability improving effect is pronounced when the ratio of the length with respect to the width (the aspect ratio (length/width)) of the electronic device (flexible tube) is high. The relationship between the aspect ratio of the electronic device (flexible tube) and the reliability will be described later.

Figure 2:
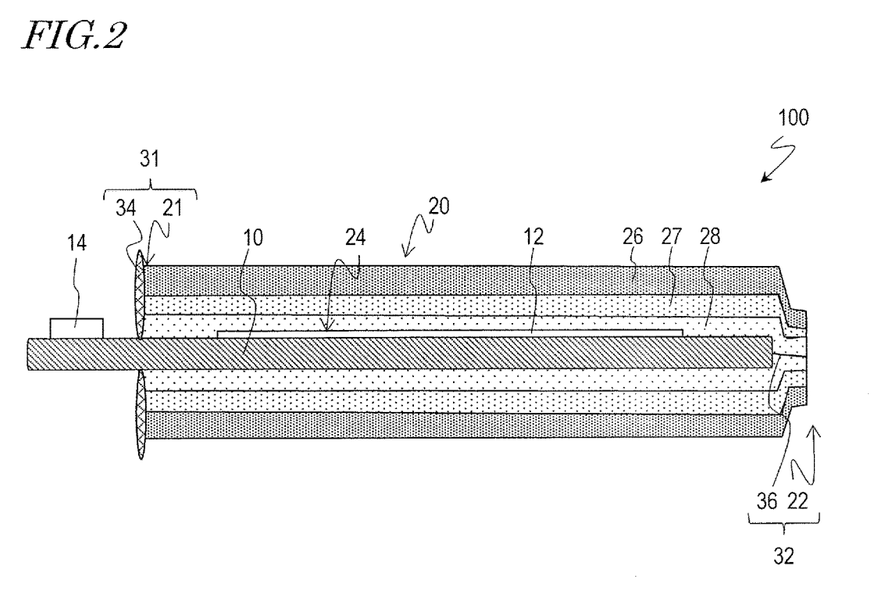
FIG. 2 A schematic cross-sectional view of the electronic device 100, taken along line 2B-2B' of FIG. 1.
Figure 3:
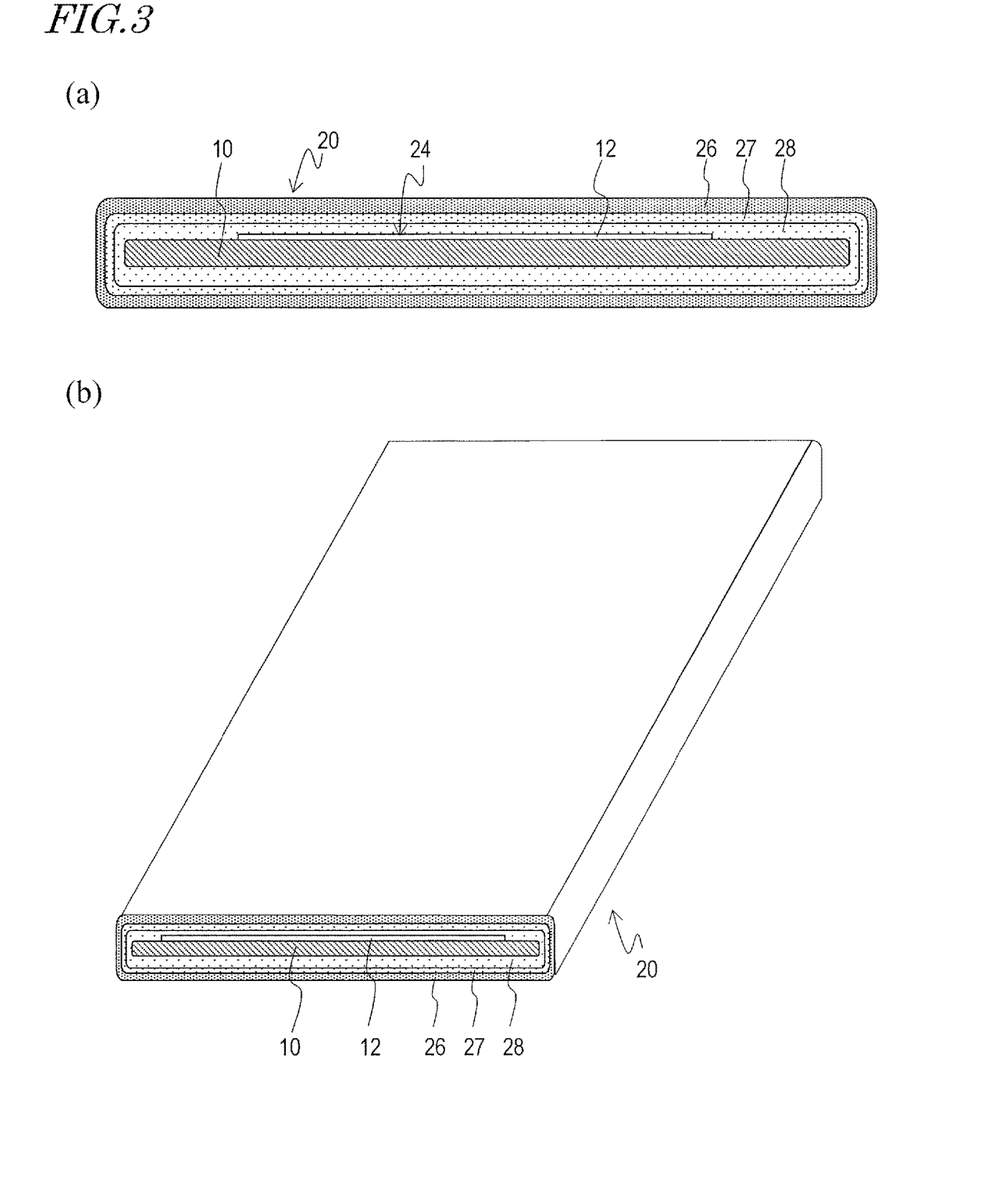

FIG. 2 and FIG. 3 show a schematic cross-sectional view and a perspective view of the electronic device 100. FIG. 2 is a schematic cross-sectional view taken along line 2B-2B' of FIG. 1, FIG. 3(a) is a schematic cross-sectional view taken along line 3B-3B' of FIG. 1, and FIG. 3(b) is a perspective view.

As shown in FIG. 2 and FIG. 3, the flexible tube of the electronic device 100 includes a tube base material 26, a gas barrier layer 27 on the inner side of the tube base material 26, and a seal layer 28 on the inner side of the gas barrier layer 27. As shown in FIG. 2 and FIG. 3, neither a gas nor a liquid is present in the sealed space 24 of the electronic device 100. That is, the inner surface of the flexible tube 20 is in intimate contact with a part of the flexible substrate 10 that is present in the sealed space 24 and the device portion 12. Note however that the electronic device according to the embodiment of the present invention is not limited to this. For example, the sealed space 24 may be filled with an inert gas or an insulative inert liquid as in an electronic device 100A to be described later (see FIG. 4).

The tube base material 26 of the flexible tube 20 includes polyethylene terephthalate (PET), for example. The thickness of the tube base material 26 is 50 µm, for example.

The gas barrier layer 27 includes a metal, an inorganic oxide or an inorganic nitride, for example. The gas barrier layer 27 includes aluminum (Al), aluminum oxide (alumina: $Al_2O_3$), silicon dioxide ($SiO_2$) or a silicon nitride ($SiN_x$), for example. The gas barrier layer 27 may be a single layer or may have a multi-layer structure including a plurality of layers laminated together. The gas barrier layer 27 may have a structure, for example, including silicon dioxide layers and silicon nitride layers alternating with each other, with silicon dioxide layers sandwiching these layers therebetween ($SiO_2$/$(SiN_x/SiO_2)_n$/$SiO_2$). The thickness of the gas barrier layer 27 is 1 µm to 2 µm, for example.

The gas barrier layer 27 is deposited on the inner side of the tube base material 26 by using a chemical vapor deposition (CVD) method, a physical vapor deposition (PVD) method or a sputtering method, for example. Japanese Patent No. 4945860, for example, discloses a method for depositing a thin film of a metal, a metal oxide or a ceramic on the inner side of a tube. If the gas barrier layer 27 is formed by an inorganic oxide (e.g., alumina), the gas barrier layer 27 may be deposited by using an atomic layer deposition (ALD) method.

When the electronic device 100 functions as a display device, the gas barrier layer 27 is preferably formed by a material that has a good visible light transmittance, such as aluminum oxide, for example. When the electronic device 100 does not function as a display device, the material of the gas barrier layer 27 can be selected without taking visible light transmittance into consideration. If the electronic device 100 functions only as a sensor as described later, for example, the gas barrier layer 27 may be formed by aluminum, for example.

The seal layer 28 is formed by polyethylene (PE), for example. The thickness of the seal layer 28 is 10 μm, for example. The seal layer 28 may be formed by, for example, bonding a film-shaped material on the inner side of the gas barrier layer 27 using an adhesive.

The flexible tube 20 may further include a gas adsorption layer (not shown) between the gas barrier layer and the seal layer 28. The gas adsorption layer includes zeolite, for example. The thickness of the gas adsorption layer is 60 μm, for example. The method for depositing zeolite is disclosed in Japanese Laid-Open Patent Publication No. 2002-249313, for example.

As shown in FIG. 2, the flexible tube 20 includes end surfaces 21 and 22 at its opposite ends in the longitudinal direction. The flexible tube 20 forms the first seal structure 31 or the second seal structure 32 at each of its opposite ends. The sealed space 24 is formed in the flexible tube 20 as the opposite ends of the flexible tube 20 are closed by the first seal structure 31 and the second seal structure 32. That is, the sealed space 24 is defined by the inner surface of the flexible tube 20, the inner surface of the first seal structure 31 and the inner surface of the second seal structure 32.

The first seal structure 31 includes the end surface 21 of the flexible tube 20 and a connecting portion 34. At the first seal structure 31, the end of the flexible tube 20 is closed by the connecting portion 34, which covers the end surface 21 of the flexible tube 20. Then, the flexible substrate 10 is projecting from the first seal structure 31. The connecting portion 34 includes a resin (e.g., an epoxy resin or an acrylic resin), for example. The connecting portion 34 may be formed by a sealant known in the art that is used for attaching together substrates of a liquid crystal display device. The thickness of the connecting portion 34 is a few μm, for example. The thickness of the connecting portion 34 may be 5 μm to 10 μm, for example. Herein, the thickness of the connecting portion 34 is assumed to be the thickness in the direction normal to the end surface 21 of the flexible tube.

A portion of the surface of the connecting portion 34 that is in contact with the ambient air may be covered by an inorganic oxide (e.g., silicon dioxide), an inorganic nitride or a metal. The provision of an inorganic material or a metal on the surface of the connecting portion 34 reduces the amount of moisture and oxygen passing through the seal structure.

The second seal structure 32 includes the end surface 22 of the flexible tube 20 and a welded surface 36. The welded surface 36 is where sheets of the seal layer 28 are welded together. The welding of the seal layer 28 can be performed by using heat and/or pressure. At the second seal structure 32, the end of the flexible tube 20 is closed by the welded surface 36.

The connecting portion 34 and/or the welded surface 36 may be referred to as a seal portion. A seal structure includes an end surface of the flexible tube 20 and a seal portion. A seal portion is not limited to the connecting portion 34 or the welded surface 36 as long as it has a property of closing an end of the flexible tube 20. Herein, the first seal structure 31 includes the connecting portion 34 as a seal portion and the second seal structure 32 includes the welded surface 36 as a seal portion, but the seal structure is not limited to these. For example, the first seal structure 31 and the second seal structure 32 may each include the connecting portion 34 and/or the welded surface 36 as a seal portion.

Referring again to FIG. 1 and FIG. 2, the structure and the function of the electronic device 100 will be described in detail.

The flexible substrate 10 is formed by using a polyimide (PI) resin or a polyethylene naphthalate (PEN) resin, for example.

The device portion 12 supported on the flexible substrate 10 includes a plurality of thin film transistors (TFTs) arranged in a matrix pattern of rows and columns, for example. The TFTs are preferably formed on the flexible substrate 10 at a low temperature. For example, the TFTs are formed at 300° C. or less if the flexible substrate 10 is a polyimide resin film, and at 150° C. or less if the flexible substrate 10 is a polyethylene naphthalate resin film. For example, TFTs using an oxide semiconductor as the material of the active layer are preferably used because they are formed at a low temperature.

The active layer of a TFT of the device portion includes a semiconductor based on In—Ga—Zn—O (hereinafter referred to simply as an "In—Ga—Zn—O-based semiconductor"), for example. Herein, the In—Ga—Zn—O-based semiconductor is a ternary oxide of In (indium), Ga (gallium) and Zn (zinc), and the ratio (composition ratio) between In, Ga and Zn is not limited to any particular ratio, examples of which include In:Ga:Zn=2:2:1, In:Ga:Zn=1:1:1, In:Ga:Zn=1:1:2, etc. The active layer of a TFT of the device portion 12 is an In—Ga—Zn—O-based semiconductor layer including In, Ga and Zn at a ratio of In:Ga:Zn=1:1:1, for example.

A TFT having an In—Ga—Zn—O-based semiconductor layer is preferably used as a driving TFT and a pixel TFT because it has a high mobility (more than 20 times that of an amorphous silicon (a-Si) TFT) and a low leakage current (less than 1/100 that of an a-Si TFT). Using TFTs having an In—Ga—Zn—O-based semiconductor layer, it is possible to significantly reduce the power consumption of the electronic device.

An In—Ga—Zn—O-based semiconductor may be amorphous or may include a crystalline portion. A crystalline In—Ga—Zn—O-based semiconductor is preferably a crystalline In—Ga—Zn—O-based semiconductor of which the c-axis is oriented generally perpendicular to the layer surface. A crystalline structure of such an In—Ga—Zn—O-based semiconductor is disclosed in Japanese Laid-Open Patent Publication No. 2012-134475, for example. The content of Japanese Laid-Open Patent Publication No. 2012-134475 is herein incorporated by reference in its entirety.

The active layer of a TFT of the device portion 12 may include another oxide semiconductor, instead of an In—Ga—Zn—O-based semiconductor. For example, it may include a Zn—O-based semiconductor (ZnO), an In—Zn—O-based semiconductor (IZO (registered trademark)), a Zn—Ti—O-based semiconductor (ZTO), a Cd—Ge—O-based semiconductor, a Cd—Pb—O-based semiconductor, CdO (cadmium oxide), an Mg—Zn—O-based semiconductor, an In—Sn—Zn—O-based semiconductor (e.g., $In_2O_3$—$SnO_2$—ZnO), an In—Ga—Sn—O-based semiconductor, etc.

The active layer of a TFT of the device portion 12 may include another semiconductor, instead of an oxide semiconductor. For example, it may include an amorphous silicon, a polycrystalline silicon, a low temperature polysilicon (LTPS), etc.

TFTs of the device portion 12 may be organic TFTs (OTFTs). Organic TFTs can preferably be used as TFTs formed on the flexible substrate 10 because they are formed at a low temperature.

The device portion 12 further includes electronic elements in accordance with the function of the electronic device 100. Depending on the electronic elements of the device portion 12, the electronic device 100 may be able to function as a display device or as a sensor, for example.

For example, when the device portion 12 includes a plurality of EL elements such as organic light-emitting diodes (OLEDs), the electronic device 100 may be able to function as a display device. The electronic device 100, which may be able to function as a display device, is not limited to an organic EL display device, but may be any of various display devices, such as an electrophoretic display device, a particle migration type display device, a liquid crystal display device, etc., for example. For example, the electronic device 100, which may be able to function as a display device, may be an electronic paper (e-paper), a display panel or a touch panel combined with a display panel.

For example, when the device portion 12 includes a piezoelectric element (piezo element), the electronic device 100 may be able to function as a pressure sensor for detecting pressure. A piezoelectric element is an element for converting a force (pressure) applied on a piezoelectric material into a voltage. A piezoelectric material has such a property that it deforms under an applied force (pressure) and exhibits a polarization (surface charge) in proportion to the force. The pressure applied on a piezoelectric material is converted to a surface charge of the piezoelectric material to be read out by a TFT connected to the piezoelectric element. A polymer film having a piezoelectric property may be used as a piezoelectric material. A piezoelectric polymer film is formed by polyvinylidene difluoride (PVDF) or polylactic acid, for example. The electronic device 100 as described above may be able to function also as a shape measurement sensor for measuring position and rotation, for example. When the device portion 12 includes a piezoelectric element for converting a voltage to a force (pressure), the electronic device 100 may be able to function as an actuator, which utilizes the effect by which a piezoelectric material deforms under an applied voltage (the inverse piezoelectric effect).

The driver circuit portion 14 is a portion for driving the electronic elements of the device portion 12. The driver circuit portion 14 includes a driver IC for supplying predetermined signals to TFTs of the device portion 12 arranged in a matrix pattern (a TFT array), for example. The driver circuit portion 14 includes a gate driver and a source driver, for example.

As shown in FIG. 1 and FIG. 2, the driver circuit portion 14 of the electronic device 100 is formed on the flexible substrate 10. As shown in FIG. 1 and FIG. 2, the driver circuit portion 14 of the electronic device 100 is outside the sealed space 24. The driver circuit portion 14 may be covered by a protection cap (not shown). The protection cap covering the driver circuit portion 14 may be made of a hard material having no flexibility. The protection cap may be formed by a plastic or a metal, for example. If the driver circuit portion 14 is outside the sealed space 24, covering the driver circuit portion 14 with the hard protection cap will not detract from the flexibility of the device portion 12.

The electronic device 100 is string-shaped, for example. Herein, "string shape" refers to a shape of an electronic device of which the length-to-width aspect ratio is 10 or more. The length of the electronic device is the length in the longitudinal direction of the flexible substrate, for example. The length of the electronic device may be defined as the length, in the longitudinal direction, of a portion of the flexible substrate that is covered by the flexible tube. The width of the electronic device is the length in the width direction of the flexible tube, for example. The thickness of the electronic device is the length in a direction perpendicular to the longitudinal direction and the width direction of the flexible tube, for example. The length of the electronic device 100 is 450 mm to 452 mm, for example, the width of the electronic device 100 is 5 mm, for example, and the thickness of the electronic device 100 is 0.2 mm to 0.3 mm, for example. The length of the flexible substrate 10 (the length in the longitudinal direction) is 450 mm to 452 mm, for example. The length of a portion of the flexible substrate 10 that supports the device portion 12 is 448 mm, for example, and a portion thereof that supports the driver circuit portion 14 is 2 mm to 4 mm, for example. The width of the flexible substrate 10 (the length in the width direction) is 4.95 mm, for example, and the thickness of the flexible substrate 10 (the length in a direction perpendicular to the longitudinal direction and the width direction) is 30 µm to 40 µm, for example.

Note however that the length, the width and the thickness of the electronic device according to the embodiment of the present invention are not limited to those set forth above. The length-to-width aspect ratio of the electronic device according to the embodiment of the present invention may be 10 to 50, for example. The length of the electronic device according to the embodiment of the present invention may be 50 mm to 1500 mm, for example, the width of the electronic device according to the embodiment of the present invention may be 5 mm to 30 mm, for example, and the thickness of the electronic device according to the embodiment of the present invention may be 0.05 mm to 0.2 mm, for example.

Now, the seal structure length is defined. The seal structure length is the length of the total distance over which sheets of the flexible tube or the resin substrate are attached together in order to seal electronic elements. Since the area where sheets of the flexible tube or the resin substrate are attached together has a poorer water vapor barrier property and a poorer oxygen barrier property than the flexible tube itself or the resin substrate itself, longer seal structure lengths result in higher possibilities of the ambient moisture and oxygen entering the sealed space.

For example, assuming that the length-to-width aspect ratio of the electronic device 100 is 10 (assuming that the width of the electronic device 100 is D and the length thereof is 10D), the seal structure length of the electronic device 100 is twice the width of the electronic device 100 (2D). The seal structure length for a conventional electronic device of the same size is twice the sum of the length and the width of the electronic device (22D). Since the seal structure length of the electronic device 100 is shorter than that of a conventional electronic device (it is 0.09 with the seal structure length of a conventional electronic device being 1), the amount of moisture and/or oxygen entering the sealed space 24 is small, and the electronic device 100 has a good reliability. Assuming x is the length-to-width aspect ratio of the electronic device, the seal structure length of the electronic device 100 is $1/(1+x)$ with the seal structure length of a conventional electronic device being 1. It is possible to more effectively improve the reliability of the electronic device 100 by increasing the length-to-width aspect ratio of the electronic device 100.

The electronic device 100 is not limited to a string shape. The length-to-width aspect ratio of the electronic device 100 may be less than 10. When the length-to-width aspect ratio of the electronic device 100 is less than 10, the electronic device 100 can be preferably used as a display device, for example.

Herein, the driver circuit portion 14 is formed on the flexible substrate 10, but the electronic device according to the embodiment of the present invention is not limited to this. The driver circuit portion 14 of the electronic device according to the embodiment of the present invention does not need to be supported on the flexible substrate 10. The driver circuit portion 14 of the electronic device according to the embodiment of the present invention may be supported on a substrate (not shown) different from the flexible substrate 10. That is, the driver circuit portion 14 may be provided on a substrate different from the flexible substrate 10, with the substrate being electrically connected to the flexible substrate 10.

The electronic device 100 may further include a control circuit portion (not shown). The control circuit portion supplies predetermined signals (including, for example, a start pulse signal, a clock signal and a digital image signal) to the driver circuit portion 14, for example. The control circuit portion is outside the sealed space 24, for example.

The electronic device 100 may further include a plurality of terminals (not shown) connected to the device portion 12 or the driver circuit portion 14. The plurality of terminals connected to the device portion 12 or the driver circuit portion 14 may be outside the sealed space 24.

Herein, the driver circuit portion 14 is outside the sealed space 24, but the electronic device according to the embodiment of the present invention is not limited to this. The driver circuit portion 14 of the electronic device according to the embodiment of the present invention may be inside the sealed space 24. Then, the plurality of terminals connected to the device portion 12 or the driver circuit portion 14 may be outside the sealed space 24 or may be inside the sealed space 24. When the plurality of terminals connected to the device portion 12 or the driver circuit portion 14 are inside the sealed space 24, the control circuit portion may also be inside the sealed space 24. The control circuit portion may have a contactless power receiving and/or NFC (Near Field Communication) function. The contactless power receiving function refers to the function of receiving power from a contactless power transmission device using a contactless power transmission (wireless power supply) technique. The contactless power transmission technique is of an electromagnetic induction type or a magnetic resonance type, for example. The control circuit portion having the contactless power receiving function includes a power-receiving electrode, for example. The control circuit portion having the NFC (Near Field Communication) function is capable of transmitting/receiving signals and/or receiving power using a near field communication technique.

A method for manufacturing the electronic device 100 will now be described.

First, the flexible tube 20 is provided. For example, a flexible tube of any length may be provided and cut to a length needed. The diameter of the flexible tube is 3.5 mm, for example. The diameter of the flexible tube is 0.65 to 4, for example, with the width of the flexible substrate 10 being 1.

Next, the flexible substrate 10 is provided, and the device portion 12 is formed.

A transfer method may be used, for example, to form TFTs on the flexible substrate. In a transfer method, a TFT array is formed on a polyimide film deposited on a glass substrate, and then the polyimide film with the TFT array formed thereon is peeled off the glass substrate, and bonded on the flexible substrate. The polyimide film is formed by, for example, applying polyimide in a solution form on a glass substrate (e.g., to a thickness of 100 µm) and annealing the polyimide in a vacuum. The thickness of the polyimide film is 10 µm or less, for example. The process of forming a TFT array on a polyimide film on a glass substrate may be a process known in the art. A plurality of TFT arrays to be used for one electronic device may be formed on a polyimide film (multiple-array transfer). When the multiple-array transfer is performed, arrays are transferred onto the flexible substrate, which is then cut into pieces corresponding to electronic devices.

Using a transfer method, even TFTs that are formed at a high temperature can be formed on the flexible substrate 10. For example, although a process of forming a-Si TFTs can reach 300° C. to 350° C., a-Si TFTs can be formed on the flexible substrate 10 using a transfer method. TFTs that can be formed at a low temperature may be formed directly on the flexible substrate 10 without using a transfer method.

Electronic elements in accordance with the function of the electronic device 100 are further formed on the flexible substrate 10, thereby forming the device portion 12. Lines or terminals connected to the device portion 12 for connecting together the device portion 12 and the driver circuit portion 14 may be further formed on the flexible substrate 10.

Next, the flexible substrate 10 is inserted into the flexible tube 20. The flexible substrate 10 projects from one end surface 21, of the end surfaces 21 and 22, of the flexible tube 20. The flexible substrate 10 does not project from the other end surface 22. The flexible substrate 10 is placed so that the end of the flexible substrate 10 is located 0.2 mm inside from the other end surface 22 in the longitudinal direction of the flexible tube 20, for example. Then, the device portion 12 is inside the flexible tube 20.

Next, the flexible tube 20 is evacuated in an inert gas atmosphere or a vacuum. The inert gas is nitrogen or a rare gas (e.g., argon, helium or neon), for example. The flexible tube 20 is brought into intimate contact with a part of the flexible substrate 10 that is present in the flexible tube 20 and the device portion 12.

Next, the first seal structure 31 and the second seal structure 32 are formed at the opposite ends of the flexible tube 20 in an inert gas atmosphere or a vacuum. The sealed space 24 is formed in the flexible tube 20 as the opposite ends of the flexible tube 20 are closed by the first seal structure 31 and the second seal structure 32. Neither a gas nor a liquid is present in the sealed space 24. A part of the flexible substrate 10 and the device portion 12 are inside the sealed space 24, with the rest of the flexible substrate 10 being outside the sealed space 24.

Next, the driver circuit portion 14 is formed outside the sealed space 24. For example, a driver IC is connected to lines or terminals connected to the device portion 12 on the flexible substrate 10.

The electronic device 100 is manufactured through the steps described above. A protection cap may be put on the driver circuit portion 14. Then, necessary lines are extracted from the protection cap. The step of forming the driver circuit portion 14 may be performed before inserting the flexible substrate 10 into the flexible tube 20. The driver circuit portion 14 may be formed integral with a TFT array (a driver monolithic type) on the polyimide film or the flexible substrate 10.

Figure 4:
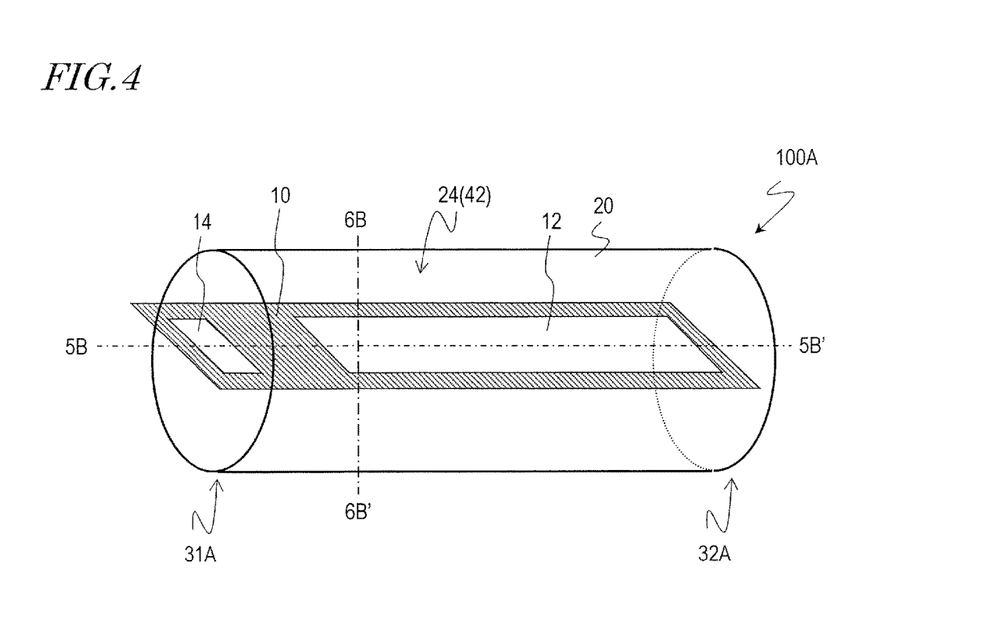
FIG. 4 A view schematically showing another electronic device 100A according to an embodiment of the present invention.

Next, referring to FIG. 4, a structure of another electronic device 100A of the present embodiment will be described. FIG. 4 is a view schematically showing the electronic device 100A. The direction along line 5B-5B' of FIG. 4 may be referred to as the longitudinal direction of the flexible tube 20, and the direction along line 6B-6B' of FIG. 4 may be referred to as the width direction of the flexible tube 20.

The electronic device 100A is different from the electronic device 100 in that the sealed space 24 in the flexible tube 20 is filled with an inert gas 42. The electronic device 100A may be the same as the electronic device 100 except that the sealed space 24 is filled with the inert gas 42. The electronic device 100A has no seal structure along edges extending in the longitudinal direction of the flexible tube 20, thereby preventing the ambient moisture and oxygen from entering the sealed space 24. The electronic device 100A has a good reliability because the performance of electronic elements is prevented from deteriorating.

The inert gas 42 is nitrogen or a rare gas (e.g., argon, helium or neon), for example. Herein, "inert" means having a low reactivity (being physically and chemically stable). The sealed space 24 of the electronic device 100A may be filled with an insulative inert liquid (e.g., perfluorocarbon in a liquid form) instead of the inert gas 42. Since the sealed space 24 is filled with the inert gas 42, the electronic device 100A has a cylindrical shape, for example. Having a cylindrical shape and being aesthetically appealing, the electronic device 100A can preferably be used as an electronic device (e.g., a display device) that is used as an interior object.

Figure 5:
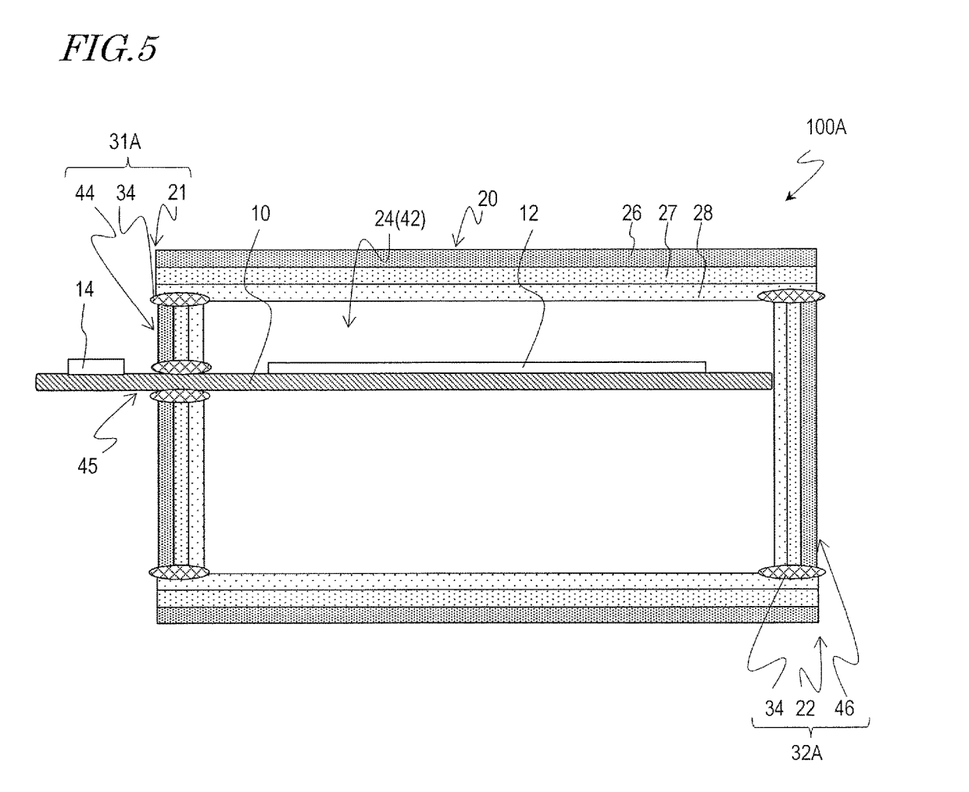
FIG. 5 A schematic cross-sectional view of the electronic device 100A, taken along line 5B-5B' of FIG. 4.

One side of the flexible substrate 10 of the electronic device 100A is arranged substantially parallel to the longitudinal direction of the flexible tube 20, as shown in FIG. 4 and FIG. 5, for example. The present invention is not limited to this, and the flexible substrate 10 of the electronic device 100A may be arranged in a spiral pattern along the inner side of the flexible tube 20. When the flexible substrate 10 is arranged in a spiral pattern, the electronic device 100A has a good bending resistance.

Figure 6:
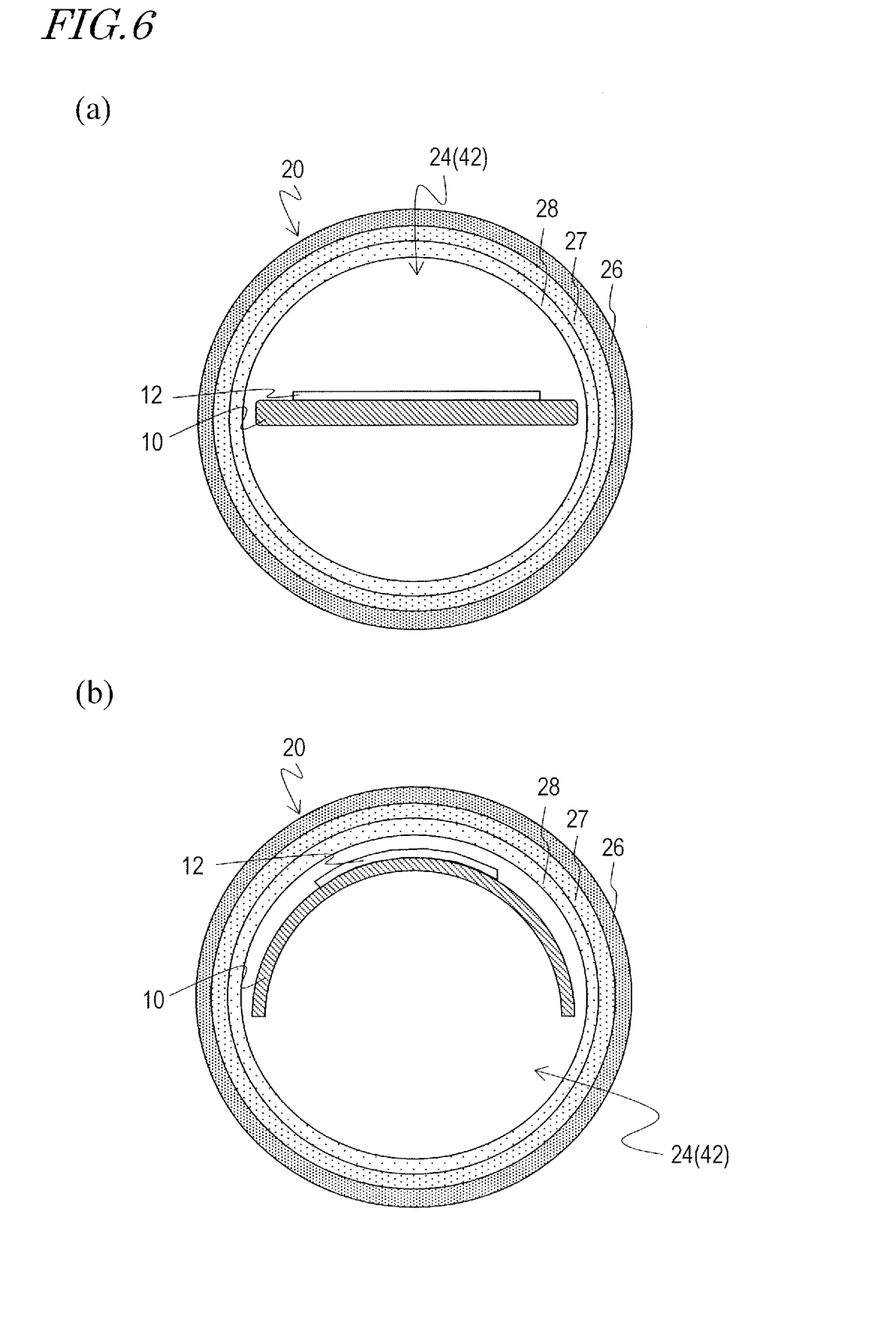

FIG. 5 and FIG. 6 show schematic cross-sectional views of the electronic device 100A. FIG. 5 is a schematic cross-sectional view taken along line 5B-5B' of FIG. 4, and FIG. 6 is a schematic cross-sectional view taken along line 6B-6B' of FIG. 4.

As shown in FIG. 5, the flexible tube 20 forms a first seal structure 31A and a second seal structure 32A at the opposite ends thereof.

The first seal structure 31A includes the end surface 21 of the flexible tube 20, and includes the connecting portion 34 and a lid portion 44 as a seal portion. As shown in FIG. 5, the lid portion 44 has the same layered structure as the flexible tube 20, for example. The lid portion 44 may be formed by a material different from the flexible tube 20. The lid portion 44 has a shape and a size such that it can cover the end surface 21 of the flexible tube 20, for example. For example, when the electronic device 100A has a cylindrical shape, the lid portion 44 has a substantially circular shape whose diameter is substantially equal to the diameter of the cylinder. The lid portion 44 has a slit 45 made in conformity with the shape and size of the cross section of the flexible substrate 10. The flexible substrate 10 projects from the first seal structure 31A passing through the slit 45. The connecting portion 34 is provided between the lid portion 44 and the flexible tube 20 and between the slit 45 and the flexible substrate 10, for example.

When the lid portion 44 is formed by the same material as the flexible tube 20, the lid portion 44 and the seal layer 28 of the flexible tube 20 can be welded together. In such a case, the first seal structure 31A may further include a welded surface as a seal portion. The seal portion of the first seal structure 31A is not limited to the connecting portion 34 and the lid portion 44 (or the connecting portion 34, the lid portion 44 and the welded surface) as long as it has a property of closing an end of the flexible tube 20.

The second seal structure 32A includes the end surface 22 of the flexible tube 20, and includes the connecting portion 34 and a lid portion 46 as a seal portion. The lid portion 46 of the second seal structure 32A may be formed by the same material as the lid portion of the first seal structure 31A or by a different material. Since the flexible substrate 10 does not project from the second seal structure 32A, the lid portion 46 of the second seal structure 32A includes no slit. The second seal structure 32A may be the same as the first seal structure 31A except that the lid portion 46 has no slit.

As shown in FIG. 6, as the sealed space 24 of the electronic device 100A is filled with the inert gas 42, the shape of the flexible substrate 10 can be changed without changing the shape of the electronic device 100A. For example, the flexible substrate 10 may be a flat surface as shown in FIG. 6($a$), or the flexible substrate 10 may be a curved surface in conformity with the flexible tube 20 as shown in FIG. 6($b$).

The electronic device 100A is string-shaped, for example. The electronic device 100A is substantially a cylinder extending in the longitudinal direction of the flexible tube 20, for example. The diameter of the cylindrical electronic device 100A is 10 mm to 20 mm, for example, and the length of the electronic device 100A is 450 mm, for example. When the electronic device 100A is a cylinder, the width of the electronic device 100A is the diameter of the cylinder, for example.

For example, assuming that the length-to-width aspect ratio of the cylindrical electronic device 100A is 10 (the width of the electronic device 100A is D and the length thereof is 10D), the seal structure length of the electronic device 100A is twice the circumference of the cylinder ($2\pi D$). The seal structure length of an electronic device of the same size that is produced by a conventional manufacturing method is the circumference of the cylinder multiplied by two plus the length of the electronic device multiplied by two ($2\pi D+20D$). Since the electronic device 100A has a shorter seal structure length than an electronic device produced by a conventional manufacturing method, the amount of moisture and/or oxygen entering the sealed space is small and the electronic device 100A has a good reliability.

When the length-to-width aspect ratio of the cylindrical electronic device 100A is denoted as x, the seal structure length of the electronic device 100A is $\pi/(\pi+x)$ with the seal structure of an electronic device produced by a conventional manufacturing method being 1. It is possible to more effectively improve the reliability of the electronic device 100A by increasing the length-to-width aspect ratio of the electronic device 100A.

The electronic device 100A is not limited to a string shape. The length-to-width aspect ratio of the electronic device 100A may be less than 10.

A method for manufacturing the electronic device 100A will now be described. Like steps to those of the method for manufacturing the electronic device 100 will not be described.

First, the flexible tube 20 is provided, and the lid portion 44 and the lid portion 46 are provided. For example, for the flexible tube 20, a flexible tube of any length may be provided and cut to a length needed. The diameter of the flexible tube is 10 mm to 20 mm, for example. The diameter of the flexible tube is equal to the length of the diameter of the cylindrical electronic device 100A, for example.

When the lid portion 44 and the lid portion 46 are formed by the same material as the flexible tube 20, the lid portion 44 and the lid portion 46 can be provided by cutting portions off the material of the flexible tube 20. The lid portion 44 includes the slit 45 made in conformity with the cross section of the flexible substrate 10. In an inert gas atmosphere or a vacuum, the flexible tube 20 and the lid portion 44 are bonded together with an adhesive applied therebetween and the flexible tube 20 and the lid portion 46 are bonded together with an adhesive applied therebetween. The applied adhesive becomes the connecting portion 34.

After the flexible substrate 10 is provided and the device portion 12 is formed, the flexible substrate 10 is inserted into the flexible tube 20 through the slit 45 of the lid portion 44 of the first seal structure 31A in an inert gas atmosphere or a vacuum. The flexible tube 20 is filled with the inert gas 42 in an inert gas atmosphere or a vacuum. The slit 45 of the first seal structure 31A and the flexible substrate 10 are bonded together with an adhesive applied therebetween, thereby forming the sealed space 24. The applied adhesive becomes the connecting portion 34.

(Embodiment 2)

Figure 7:
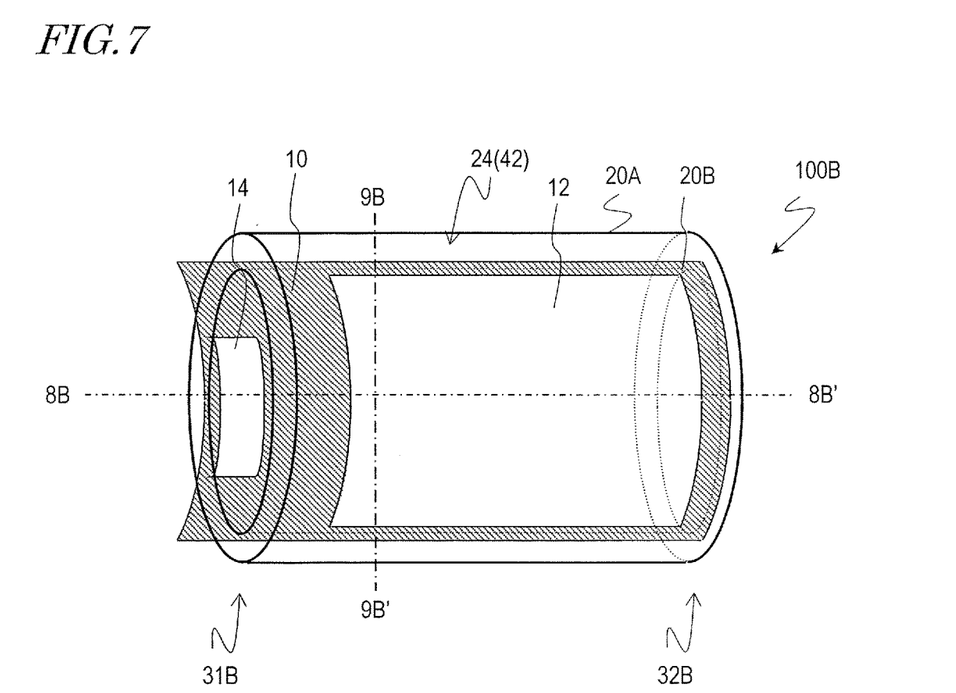
FIG. 7 A view schematically showing still another electronic device 100B according to an embodiment of the present invention.

Next, referring to FIG. 7, a structure of an electronic device 100B according to Embodiment 2 of the present invention. FIG. 7 is a view schematically showing the electronic device 100B. The direction along line 8B-8B' of FIG. 7 may be referred to as the longitudinal direction of a first flexible tube 20A or a second flexible tube 20B, and the direction along line 9B-9B' of FIG. 7 may be referred to as the width direction of the first flexible tube 20A and the second flexible tube 20B.

The electronic device 100B is different from the electronic device 100A in that the first flexible tube 20A and the second flexible tube 20B are used instead of the flexible tube 20. The electronic device 100B may be the same as the electronic device 100A except that the electronic device 100B includes two flexible tubes.

The first flexible tube 20A has a water vapor transmission rate of less than $10^{-3}$ g/(m$^2$·24 h) and an oxygen transmission rate of less than $10^{-2}$ ml/(m$^2$·24 h·MPa). The second flexible tube 20B has a water vapor transmission rate of less than $10^{-3}$ g/(m$^2$·24 h) and an oxygen transmission rate of less than $10^{-2}$ ml/(m$^2$·24 h·MPa). The second flexible tube 20B is provided on the inner side of the first flexible tube 20A. The first flexible tube 20A and the second flexible tube 20B form a first seal structure 31B and a second seal structure 32B at the opposite ends thereof. The sealed space 24 is present between the first flexible tube 20A and the second flexible tube 20B.

The electronic device 100B has no seal structure along edges extending in the longitudinal direction of the first flexible tube 20A and the second flexible tube 20B, thereby preventing the ambient moisture and oxygen from entering the sealed space 24. The electronic device 100B has a good reliability because the performance of electronic elements is prevented from deteriorating.

Figure 8:
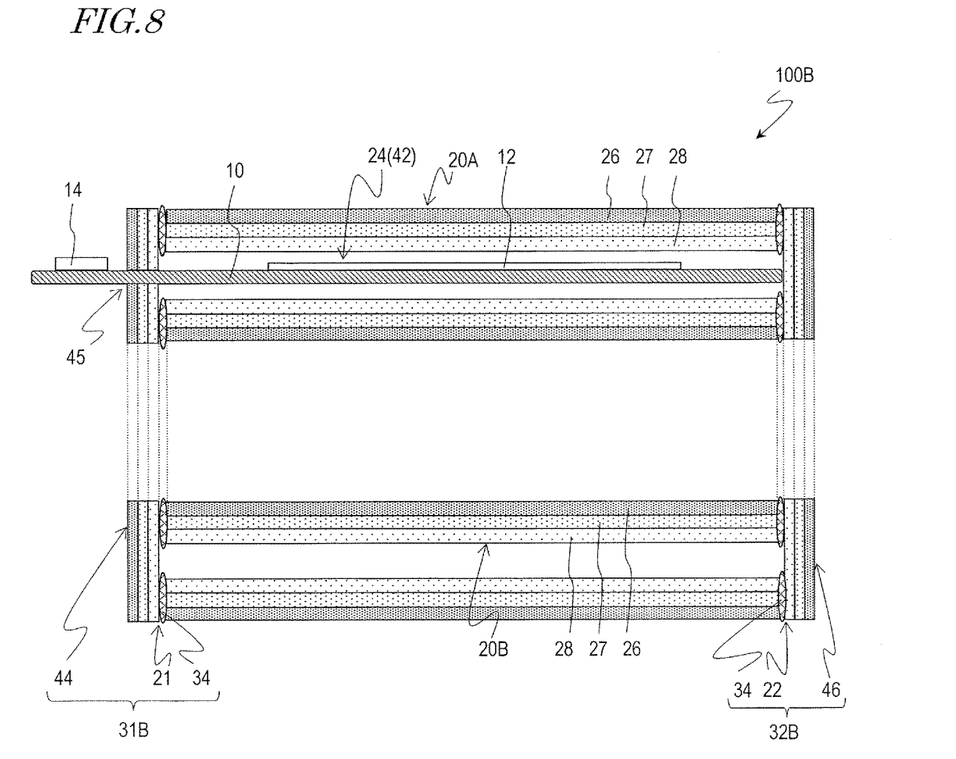
FIG. 8 A schematic cross-sectional view of the electronic device 100B, taken along line 8B-8B' of FIG. 7.
Figure 9:
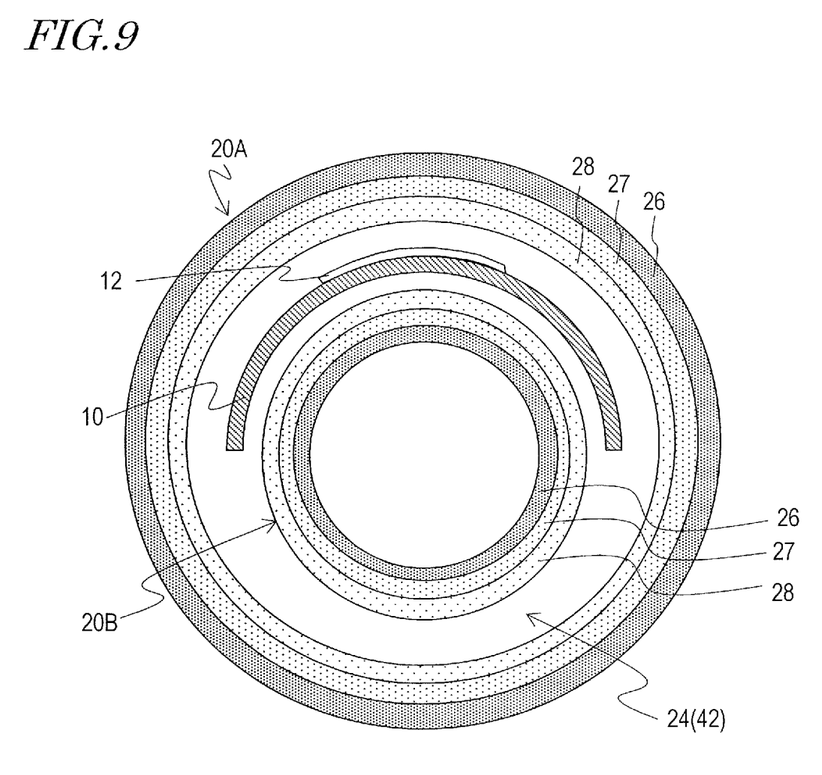
FIG. 9 A schematic cross-sectional view of the electronic device 100B, taken along line 9B-9B' of FIG. 7.

FIG. 8 and FIG. 9 show schematic cross-sectional views of the electronic device 100B. FIG. 8 is a schematic cross-sectional view taken along line 8B-8B' FIG. 7, and FIG. 9 is a schematic cross-sectional view taken along line 9B-9B' of FIG. 7.

As shown in FIG. 8 and FIG. 9, the first flexible tube 20A may be the same as the flexible tube 20 of the electronic device 100A. The second flexible tube 20B includes the tube base material 26, the gas barrier layer 27 on the outer side of the tube base material 26, and the seal layer 28 on the outer side of the gas barrier layer 27. The tube base material 26, the gas barrier layer 27 and the seal layer 28 of the second flexible tube 20B may be formed by using the same material and the same method as the tube base material 26, the gas barrier layer 27 and the seal layer 28 of the first flexible tube 20A.

As shown in FIG. 8, the first flexible tube 20A and the second flexible tube 20B have substantially the same length. As shown in FIG. 8, the space between the first flexible tube 20A and the second flexible tube 20B has end surfaces 21 and 22 at its opposite ends in the longitudinal direction thereof. The space between the first flexible tube 20A and the second flexible tube 20B forms the first seal structure 31B and the second seal structure 32B at the opposite ends thereof. The opposite ends of the space between the first flexible tube 20A and the second flexible tube 20B are closed by the first seal structure 31B and the second seal structure 32B, thereby forming the sealed space 24 between the first flexible tube 20A and the second flexible tube 20B. That is, the sealed space 24 is defined by the inner surface of the first flexible tube 20A, the outer surface of the second flexible tube 20B, the inner surface of the first seal structure 31B and the inner surface of the second seal structure 32B.

The first seal structure 31B and the second seal structure 32B do not close the opposite ends of the second flexible tube 20B, for example. In such a case, the inner side of the second flexible tube 20B is in contact with the ambient air.

As shown in FIG. 9, the flexible substrate 10 is a curved surface in conformity with the shape of the first flexible tube 20A or the second flexible tube 20B, for example. As shown in FIG. 9, the electronic device 100B can be provided in a rod shape by passing a rod-shaped metal or plastic through the inside of the second flexible tube 20B, for example. By passing a bendable material (e.g., a wire) through the inside of the second flexible tube 20B, the shape of the electronic device 100B can be changed freely.

The electronic device 100B is string-shaped, for example. The cross section of the electronic device 100B in the direction perpendicular to the longitudinal direction of the first flexible tube 20A or the second flexible tube 20B includes a double circle, for example. The outer circle of the double circle is the cross section of the first flexible tube 20A, and the inner circle is the cross section of the second flexible tube 20B. The width of the electronic device 100B is the diameter of the outer circle, for example. The diameter of the outer circle is 10 mm to 20 mm, for example. The difference between the diameter of the outer circle and the diameter of the inner circle is 0.4 mm to 1.0 mm, for example. With the diameter of the outer circle being 1, the difference between the diameter of the outer circle and the diameter of the inner circle is 0.01 to 0.2, for example. The diameter of the outer circle is 11 mm, for example, and the diameter of the inner circle is 10 mm, for example. The length of the electronic device 100B is 450 mm, for example.

For example, assuming that the length-to-width aspect ratio of the electronic device 100B is 10 (the width of the electronic device 100B is D, the length thereof is 10D, and the diameter of the inner circle is d), the seal structure length of the electronic device 100B is twice the sum of the circumference of the outer circle and the circumference of the inner circle ($2\pi(D+d)$). The seal structure length of an electronic device of the same size that is produced by a conventional manufacturing method is the sum of the circumference of the outer circle and the circumference of the inner circle multiplied by two plus the length of the electronic device multiplied by four ($2\pi(D+d)+40D$). Since the electronic device 100B according to the embodiment of the present invention has a shorter seal structure length than an electronic device produced by a conventional manufacturing method, the amount of moisture and/or oxygen entering the sealed space 24 is small and the electronic device 100B has a good reliability.

When the length-to-width aspect ratio of the electronic device 100B is denoted as x, the seal structure length of the electronic device 100B is $(\pi(D+d))/(\pi(D+d)+2Dx)$ with the seal structure length of an electronic device produced by a conventional manufacturing method being 1. Since d is greater than 0 and less than D, the seal structure length of the electronic device 100B relative to the seal structure length of an electronic device produced by a conventional manufacturing method is greater than $\pi/(\pi+2x)$ and less than $\pi/(\pi+x)$. It is possible to more effectively improve the reliability of the electronic device 100B by increasing the length-to-width aspect ratio of the electronic device 100B.

The electronic device 100B is not limited to a string shape. The length-to-width aspect ratio of the electronic device 100B may be less than 10.

A method for manufacturing the electronic device 100B will now be described. Like steps to those of the method for manufacturing the electronic device 100A will not be described.

First, the first flexible tube 20A and the second flexible tube 20B are provided. For example, for each tube, a flexible tube of any length may be provided and cut to a length needed.

Next, the second flexible tube 20B is inserted through the inside of the first flexible tube 20A in an inert atmosphere or a vacuum. The first flexible tube 20A, the second flexible tube 20B, the lid portion 44 and the lid portion 46 are bonded together with an adhesive applied therebetween in an inert gas atmosphere or a vacuum. The applied adhesive becomes the connecting portion 34.

The subsequent steps of manufacturing the electronic device 100B are substantially the same as those of the method for manufacturing the electronic device 100A.

While the sealed space 24 of the electronic device 100B is filled with the inert gas 42, the electronic device according to the embodiment of the present invention is not limited to this. Neither a gas nor a liquid may be present in the sealed space 24 of the electronic device 100B.

As described above, the seal structure lengths of the electronic device 100, the electronic device 100A and the electronic device 100B, for all of which the length-to-width aspect ratio is x, are $1/(1+x)$, $\pi/(\pi+x)$ and greater than $\pi/(\pi+2x)$ and less than $\pi/(\pi+x)$, respectively, with the seal structure length of an electronic device produced by a conventional manufacturing method being 1. With the length-to-width aspect ratio being equal, the electronic device 100 is most advantageous, followed by the electronic device 100B, in that the seal structure length can be shortened as compared with an electronic device produced by a conventional manufacturing method.

INDUSTRIAL APPLICABILITY

According to the embodiment of the present invention, it is possible to improve the reliability of a flexible electronic device. The flexible electronic device according to the embodiment of the present invention can be used as any of various electronic devices, such as a flexible display, a flexible sensor, etc., for example.

REFERENCE SIGNS LIST

10 Flexible substrate
12 Device portion
14 Driver circuit portion
20 Flexible tube
20A First flexible tube
20B Second flexible tube
21, 22 End surface
24 Sealed space
26 Tube base material
27 Gas barrier layer
28 Seal layer
31, 31A, 31B First seal structure
32, 32A, 32B Second seal structure
34 Connecting portion
36 Welded surface
42 Inert gas
44, 46 Lid portion
45 Slit
100, 100A, 100B Electronic device

The invention claimed is:

1. An electronic device comprising:
a flexible substrate, a device portion supported on the flexible substrate, and a driver circuit portion;
a first flexible tube having a water vapor transmission rate of less than $10^{-3}$ g/(m$^2$·24 h) and an oxygen transmission rate of less than $10^{-2}$ ml/(m$^2$·24 h·MPa); and
a second flexible tube provided on an inner side of the first flexible tube and having a water vapor transmission rate of less than $10^{-3}$ g/(m$^2$·24 h) and an oxygen transmission rate of less than $10^{-2}$ ml/(m$^2$·24 h·MPa), wherein:
a first seal structure at one end of the first flexible tube and the second flexible tube and a second seal structure at another end of the first flexible tube and the second flexible tube define a sealed space between the first flexible tube and the second flexible tube;
the sealed space is defined by an inner surface of the first flexible tube, an outer surface of the second flexible tube, an inner surface of the first seal structure, and an inner surface of the second seal structure;
a portion of the flexible substrate and the device portion are inside the sealed space; and
a remainder of the flexible substrate, other than the portion of the flexible substrate that is inside the sealed space, is outside the sealed space.

2. The electronic device according to claim 1, wherein the sealed space is filled with an inert gas or an insulative inert liquid.

3. The electronic device according to claim 1, wherein neither a gas nor a liquid is present in the sealed space.

4. The electronic device according to claim 1, wherein the driver circuit portion is inside the sealed space.

5. The electronic device according to claim 1, wherein the driver circuit portion is outside the sealed space.

6. The electronic device according to claim 1, wherein a plurality of terminals connected to the device portion or the driver circuit portion are outside the sealed space.

7. The electronic device according to claim 1, further comprising a control circuit portion, wherein:
the control circuit portion is inside the sealed space.

8. The electronic device according to claim 7, wherein the control circuit portion has a contactless power receiving or NFC (Near Field Communication) function.

9. The electronic device according to claim 1, wherein the first flexible tube and the second flexible tube have substantially same lengths.

10. The electronic device according to claim 1, wherein an inner side of the second flexible tube is in contact with ambient air.

11. The electronic device according to claim 1, wherein the flexible substrate is a curved surface that conforms to a shape of the first flexible tube or the second flexible tube.

12. The electronic device according to claim 1, wherein
a cross section of the first flexible tube in a direction perpendicular to a longitudinal direction of the first flexible tube is a circle, and
a cross section of the second flexible tube in a direction perpendicular to a longitudinal direction of the second flexible tube is a circle.

* * * * *